United States Patent [19]

Omura

[11] Patent Number: 5,789,767
[45] Date of Patent: Aug. 4, 1998

[54] COMPOUND SEMICONDUCTOR DEVICE

[75] Inventor: Soshi Omura, Kawasaki, Japan

[73] Assignee: Fujitsu Limited, Kawasaki, Japan

[21] Appl. No.: 906,110

[22] Filed: Aug. 5, 1997

Related U.S. Application Data

[63] Continuation of Ser. No. 611,978, Mar. 6, 1996, abandoned, Ser. No. 347,200, Nov. 21, 1994, abandoned, and Ser. No. 27,635, Mar. 8, 1993, abandoned.

[30] Foreign Application Priority Data

Mar. 12, 1992 [JP] Japan ................... 4-053563

[51] Int. Cl.$^6$ ............... H01L 31/0328; H01L 31/0336; H01L 31/072; H01L 31/109
[52] U.S. Cl. .................................................. 257/194
[58] Field of Search ....................................... 257/194

[56] References Cited

FOREIGN PATENT DOCUMENTS

| 57-68073 | 4/1982 | Japan | 257/194 |
|---|---|---|---|
| 60-86872 | 5/1985 | Japan | 257/194 |
| 62-73674 | 4/1987 | Japan | 257/194 |

OTHER PUBLICATIONS

Electronics Letters, vol. 26, No. 3, Feb. 1, 1990, A. Cappy et al., "Ultra High Transconductance 0.25 μm Gate MESFET With Strained InGaAs Buffer Layer", pp. 161–162.

Extended Abstracts of the 21st Conference on Solid State Devices and Materials, Tokyo, 1989, M. Itoh et al., "Effect of InGaAs Well Width on Low–Noise Performance in AlGaAs/InGaAs Pseudomorphic HEMT", pp. 285–288 no month.

IEEE MTT-S International Microwave Symposium Digest, Boston, MA, US, 10–14 Jun., 1991, J.C. Huang et al., "An AlGaAs/InGaAs Pseudomorphic High Electron Mobility Transistor (PHEMT) For X- and Ku-band Power Applications", pp. 713–716.

*Primary Examiner*—Stephen Meier
*Attorney, Agent, or Firm*—Staas & Halsey

[57] ABSTRACT

A compound semiconductor device having a first compound semiconductor layer, a second compound semiconductor layer containing at least In or Al which is in contact with the first compound semiconductor layer to generate a two dimensional electron gas layer in the interface between the first and second compound semiconductor layers, a third compound semiconductor layer of GaAs provided so as to be coated on the second compound semiconductor layer, a source electrode and a drain electrode electrically connected to the two dimensional electron gas layer, and a gate electrode provided between the source electrode and the drain electrode so as to be in Schottky contact with the third compound semiconductor layer.

11 Claims, 5 Drawing Sheets

COMPOUND SEMICONDUCTOR DEVICE

This application is a continuation of application Ser. No. 08/611,978, filed Mar. 6, 1996, now abandoned, which a continuation of application Ser. No. 08/347,200, filed Nov. 21, 1994, now abandoned, which is a continuation of application Ser. No. 08/027,635, filed on Mar. 8, 1993, now abandoned.

BACKGROUND OF THE INVENTION

1. Field of the Invention

The present invention relates to a semiconductor device, and more specifically, to a semiconductor device having a field effect transistor using a compound semiconductor.

Since a field effect transistor using a compound semiconductor exhibits a higher electron mobility as compared with an element using silicon, it can be operated at a higher frequency.

2. Description of the Related Art

As a field effect transistor using a compound semiconductor, there have been proposed a high electron mobility transistor (hereinafter referred to as "HEMT") and the like.

There has also been known an HEMT in which, e.g., InGaAs is used as a semiconductor material of a channel layer in order to increase the mobility of a carrier. The production process thereof will be explained in the following.

Figure 1A:
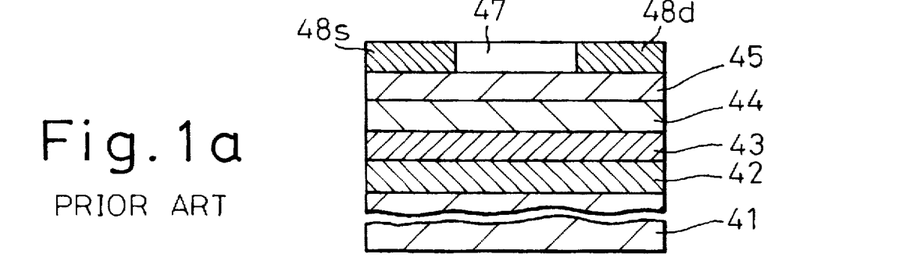
FIGS. 1a through 1d are sectional views illustrating an example of conventional semiconductor devices.

First, as illustrated in FIG. 1a, an intrinsic GaAs layer (i-GaAs layer) (42) is superimposed on a semi-insulating substrate (41), and an i-InGaAs layer as a channel layer (43) is caused to epitaxially grow on the i-GaAs layer, whereafter an n-In$_x$Ga$_{1-x}$P layer (44) as an electron supplying layer, and an n-GaAs layer as a capping layer are successively superimposed by the MOCVD method. In the above case, x is equal to 0.48, and the n-In$_x$Ga$_{1-x}$P layer (44) and the n-GaAs layer (45) are subjected to grid matching.

Subsequently, SiO$_2$ film (47) is superimposed on the entire surface of the top layer and subjected to patterning, so that it remains in the gate electrode formation region and the circumference thereof.

Thereafter, on the n-GaAs layer (45) at both the sides of the electrode formation region, which are not covered with the SiO$_2$ film, there are formed a source electrode (48s) and drain electrode (48d), which are composed of AuGe/Au.

Figure 1B:
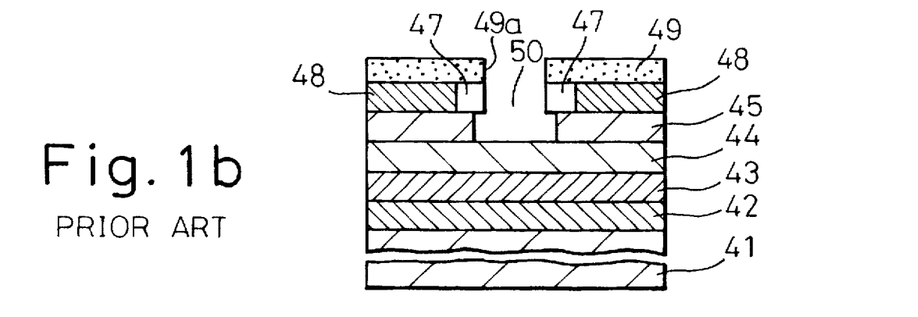

Next, a photoresist is applied to the electrodes and subjected to exposure/development and a photoresist mask (49) having a window (49a) along the gate electrode formation region is formed as illustrated in FIG. 1b, whereafter the SiO$_2$ film exposed to the outside from the photoresist mask (49) is eliminated with a buffering aqueous solution of a hydrofluoric acid, and then, the n-GaAs layer 45 underneath is selectively etched with a solution mixture of a hydrofluoric acid and hydrogen peroxide, whereby an opening 50 is formed.

Figure 1C:
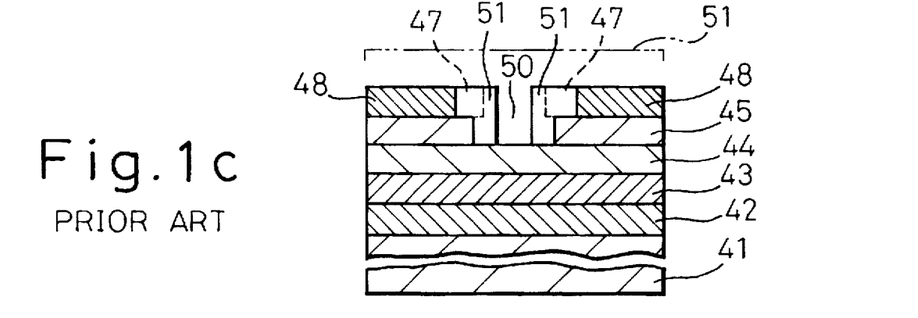

Further, the resist mask (49) is eliminated by use of a release solution or oxygen plasma, and then, an SiO$_2$ film is deposited over the entire surface of the top layer, whereafter the SiO$_2$ film is etched off in the vertical direction by a reactive ion etching method using a reactive gas such as sulfur hexafluoride (SF$_6$), so as to leave the SiO$_2$ film (51) only on the side wall of the opening (50) of the SiO$_2$ film (47) and n-GaAs layer (45), so that a side wall structure as illustrated in FIG. 1c is obtained.

Figure 1D:
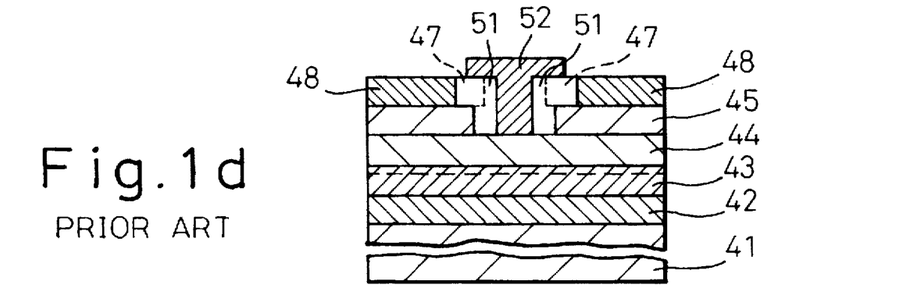

Subsequently, e.g., aluminium is deposited on the side wall structure by use of an electron beam deposition device, and the deposited aluminium is subjected to patterning, so as to form a gate electrode 52 passing through the inside of the opening (50) and in Schottky contact with the n-In$_x$Ga$_{1-x}$P layer (44) (FIG. 1d).

However, there has been a problem in that when the aforesaid HEMT is operated by application of current, a failure occurs in that the leakage current is gradually increased, resulting in noticeable hindrance of the reliability of the element.

For example, when a test was conducted at a channel temperature of 175° C., drain voltage of 2 V, drain current of 10 mA, and for a current application time of 1000 hours, the leakage current was increased by about 30 to 150% with the lapsing of time.

Figure 2:
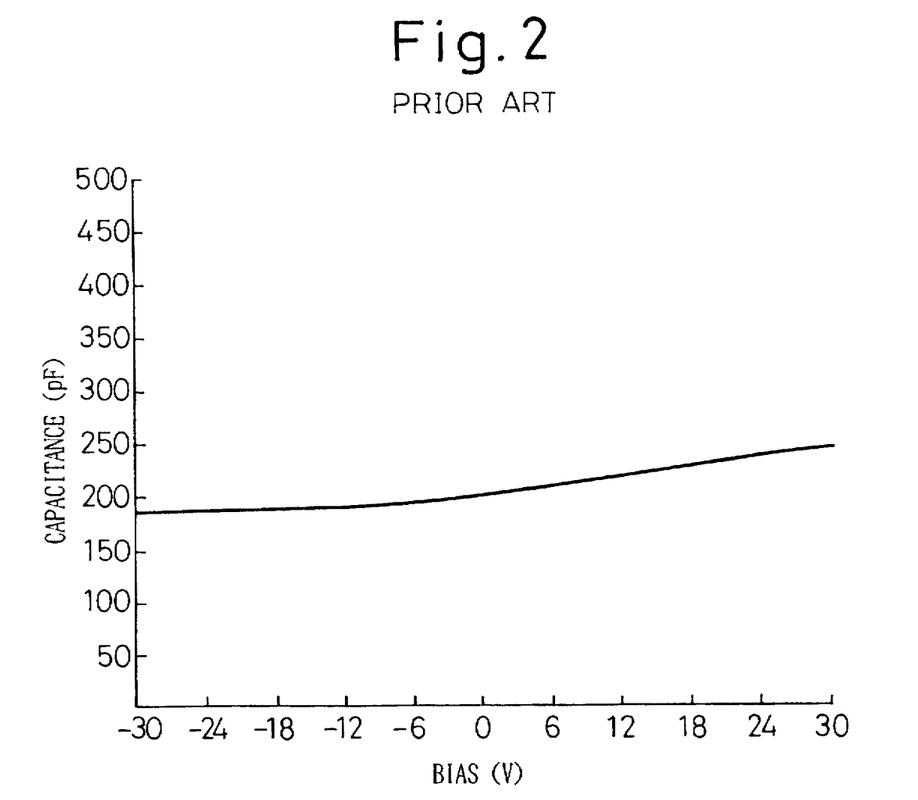
FIG. 2 is a C-V characteristic diagram of a conventional MIS diode.

Then, on examination of the relation between the bias voltage (BIAS) and capacitance (CAPACITANCE) as shown in FIG. 2 with respect to a formed MIS diode of the three-layer structure of n-InGaP/SiO$_2$/Al, no change from a stored state to a reversed state was observed, and it became clear that the capacitance was increased with the increase of bias voltage. This test was conducted at a temperature of 300° K. and a frequency of 1 MHz.

The reason why the diode came to exhibit such characteristics is considered to be that the InGaP was metamorphosed to generate a high density interfacial level, and this mechanism is presumed to be as follows.

That is, as illustrated in FIG. 1c, in the step of overall deposition of the SiO$_2$ film (51), the surface of the n-InGaP layer, which is exposed out of the opening (50), is oxidized so that In$_2$O$_2$ is formed and In is deposited, and a high density negative electric charge is generated on the interface. It is considered that the thus generated negative electric charge forms a conductive path between the same and the circumference thereof and the conductive path thus formed induces a leakage current.

Such a phenomenon has been observed also in another HEMT having InAlAs or the like as an electron supplying layer, and is supposed to be common to In-containing compound semiconductors.

Also, in a semiconductor on the surface of which a compound semiconductor containing Al as an active material is exposed, for example, an HEMT having a structure in which an AlGaAs layer is formed on a GaAs layer and a gate electrode is formed on the AlGaAs layer. In this case, Al$_2$O$_3$ is formed on the surface of the exposed AlGaAs layer. Where Al$_2$O$_3$ is formed, metallic As is formed concurrently, which results in the occurrence of a leakage current. Thus, the same problems occur as in the above-mentioned In-containing compound semiconductor.

SUMMARY OF THE PRESENT INVENTION

The present invention has been made in view of such a problem, and the object thereof is to provide a semiconductor device capable of lessening the leakage current in the circumference of a gate electrode formed on an In-containing compound semiconductor and thereby obtaining excellent transistor operating characteristics.

Figure 3A:
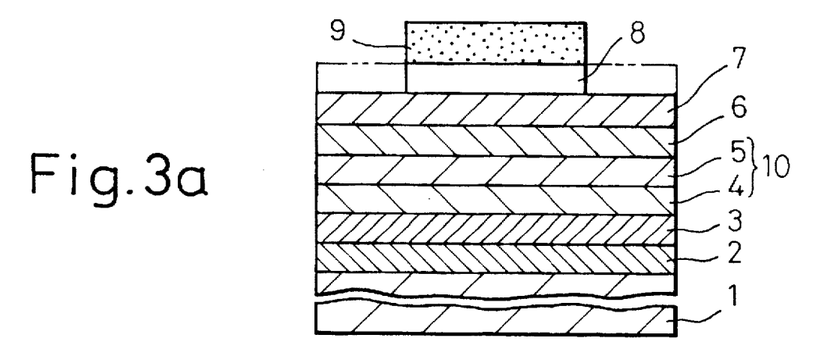
FIGS. 3a through 3f are sectional views illustrating an embodiment of the present invention.
Figure 3B:
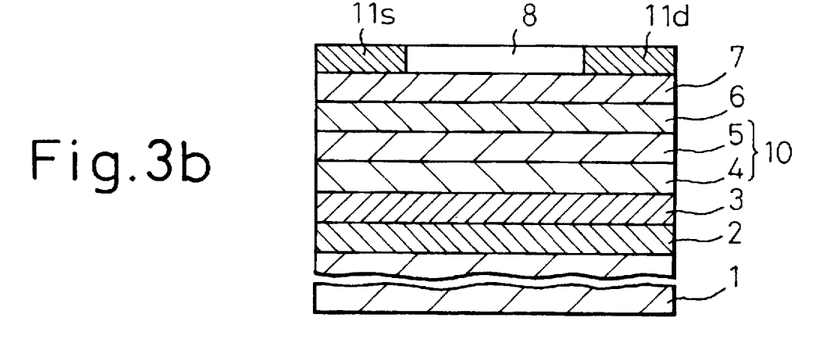
Figure 3C:
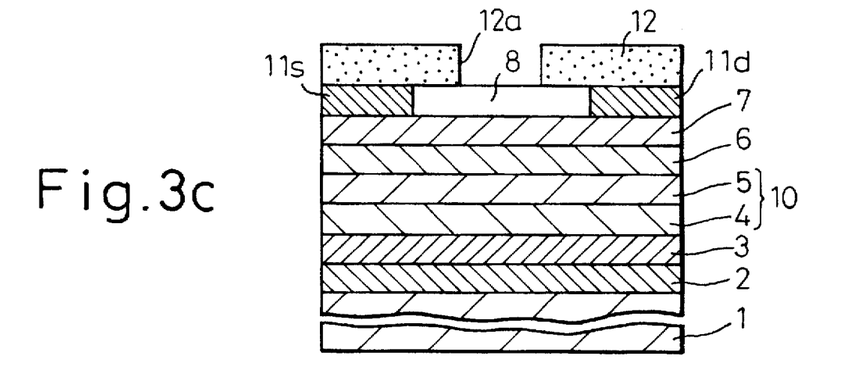
Figure 3D:
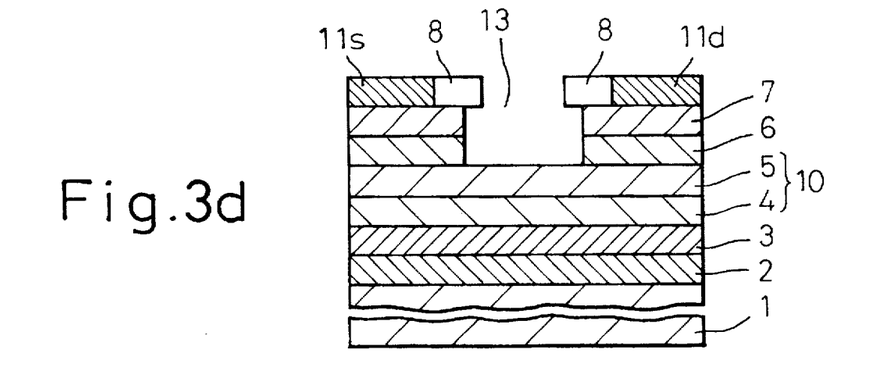
Figure 3E:
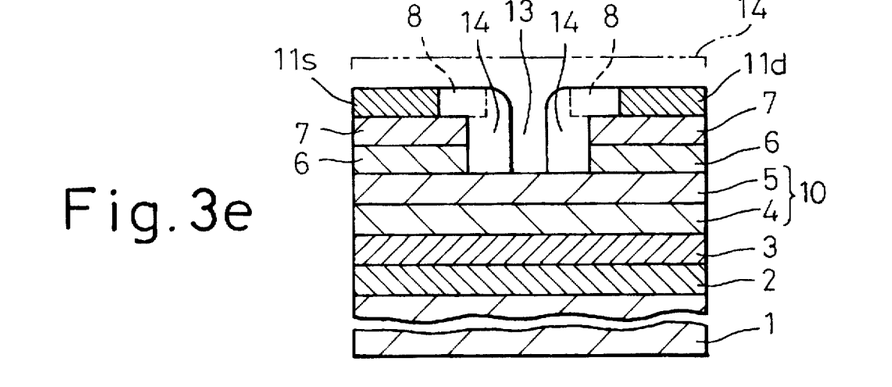
Figure 3F:
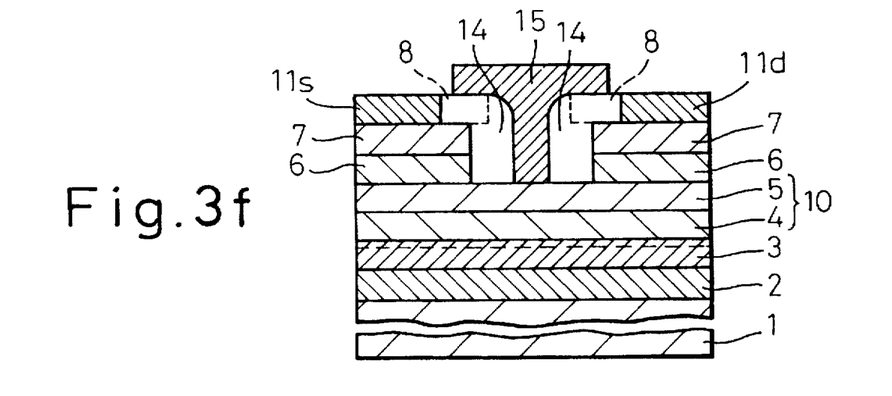

The aforesaid problem can be overcome by a semiconductor device having a field effect transistor composed of a III-V Group semiconductor, as shown in FIG. 3f, wherein an indium-containing monoconductive semiconductor layer (4) is coated with a monoconductive GaAs layer (5), a gate electrode (15) is brought into contact with said monoconductive GaAs layer (5), and said monoconductive GaAs layer (5), existing in the region at least among a source electrode (11s), drain electrode (11d) and said gate electrode (15), is covered with an insulating film (14).

Alternatively, the present invention can be attained by a semiconductor device, characterized in that the aforesaid indium-containing semiconductor layer (4) is one of the layers of InP, InGaP, InGaAsP, InAlAs, and InSb.

Alternatively, the present invention can be attained by a semiconductor device, characterized in that the aforesaid insulating film (14) is one of the films of $SiO_2$, SiN, and SiOn.

DESCRIPTION OF THE PREFERRED EMBODIMENTS

According to the present invention, an indium-containing semiconductor, such as InP, InGaP, InGaAsP, InAlAs, and InSb, is covered with a monoconductive GaAs layer and, on the monoconductive GaAs layer, GaAs there are formed a gate electrode and an insulating film. The GaAs layer preferably has a thickness of 1 Å to 500 Å.

Thus, the increasing amount of the leakage current becomes 5% or less, and therefore, the present semiconductor device is greatly improved with respect to leakage current, as compared with a field effect transistor of the conventional structure.

Figure 4:
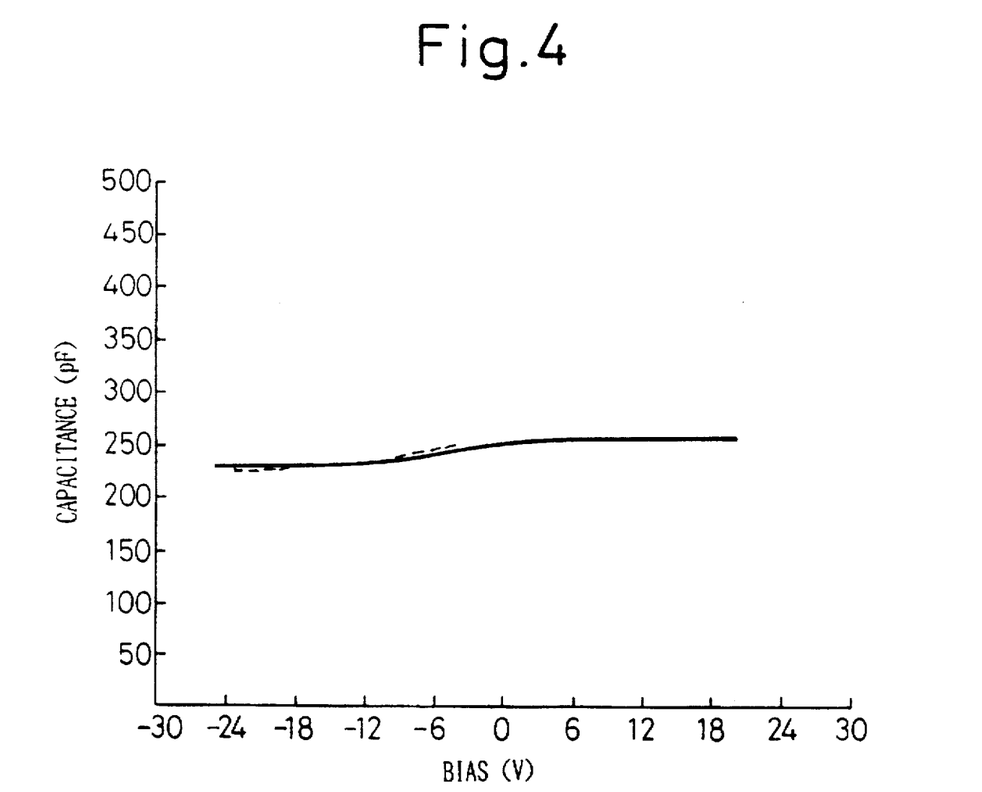
FIG. 4 is a C-V characteristic diagram of a MIS diode according to the present invention.

On examination of the C-V characteristics as for an MIS diode having the layer structure of, e.g., n-InGaP/nGaAs/$SiO_2$/Al, it was confirmed that, as illustrated in FIG. 4, the interfacial level density was decreased to a great extent. The leakage current in the circumference of the gate electrode covered with the insulating film is thereby decreased.

The aforesaid insulating film may be $SiO_2$, SiN, SiON and the like.

In addition, it becomes clear from the results of the aforesaid test that the leakage current on the interface between the monoconductive GaAs and $SiO_2$ is very slight, and it is not at all necessary to further cover the monoconductive GaAs layer in the circumference of the gate electrode (15) with an intrinsic GaAs layer, as proposed, e.g., in Japanese Unexamined Patent Publication No. 57-128070.

The embodiments of the present invention will be explained with reference to the drawings.

(a) Explanation of the first embodiment of the present invention

FIGS. 3a through 3f are sectional views illustrating the manufacturing process of the device according to the first embodiment of the present invention.

First, as illustrated in FIG. 3a, an i-GaAs layer (2) is superimposed on a semi-insulated GaAs substrate (1), and an i-InGaAs layer (3) as a channel layer is caused to epitaxially grow on the layer (2), whereafter an n-InGaP layer (4) and n-GaAs layer (5) are superimposed on the layer (3), to form these layers (4) and (5) into an electron supplying layer (10), and an n-InGaP layer (6) and n-GaAs layer (7) are superimposed on the formed electron supplying layer (10) in this order. These compound semiconductors are grown by the MOCVD method.

In the above case, an impurity capable of converting the aforesaid compound semiconductor into an n-type one, e.g., silicon, may be used, and the impurity concentration of silicon is, e.g., $1 \times 10^{18}/cm^3$.

Then, by a pyrolytic CVD method, there is deposited an $SiO_2$ film (8) to a thickness of 3000 Å. A photoresist (9) is further applied to the deposited film (8), and exposed to light and developed so as to form a mask covering the $SiO_2$ film (8) existing in the gate electrode formation region and its circumference, whereafter the $SiO_2$ film (8), which is not covered with the photoresist (9), is eliminated with a hydrofluoric acid, to expose an n-GaAs layer (7) to the outside.

Subsequently, the photoresist (9) is eliminated, whereafter AuGe/Au is fullface deposited, and the thus deposited layer is photolithographically patterned so as to leave the AuGe/Au on both the sides of the $SiO_2$ film (8), whereby a source electrode (11s) and drain electrode (11d) which are in ohmic contact with the uppermost n-GaAs layer (7) are formed (FIG. 3b).

Thereafter, a photoresist (12) is applied, and subjected to exposure/development, so that a window (12a) is formed along the gate electrode formation region (FIG. 3c). The opening size measured in the gate lengthwise direction of the window (12a) is set to about 0.5 μm.

Subsequently, the $SiO_2$ film (8) exposed to the outside through the window (12a) is eliminated with a buffering aqueous solution of hydrofluoric acid, and then, the n-GaAs layer (7) existing therebeneath is selectively etched with a solution mixture of hydrofluoric acid and hydrogen peroxide or selectively etched by reactive ion etching using a reactive gas such as $CCl_2F_2$ or CHClF, so as to form an opening (13) (FIG. 3d).

Further, the n-InGaP layer (6) exposed from the opening (13) is exposed to an aqueous solution of hydrochloric acid, so as to be etched, whereby the n-GaAs layer (5) is exposed to the outside. In this case, the n-GaAs layer (5) functions as an etching stopping layer against the hydrochloric acid.

Then, the photoresist (12) is eliminated by use of a release solution, oxygen plasma or the like, and the inside of the opening (13) is washed, whereafter an $SiO_2$ film (14) is deposited on the whole of the top surface, and the deposited film is etched off in the vertical direction by a reactive etching method using a reactive gas such as sulfur hexafluoride, so as to leave the $SiO_2$ film (14) only on the $SiO_2$ film (8) and the side wall of the opening (13) of the n-GaAs layer, whereby a side wall structure as illustrated in FIG. 3e is obtained.

Subsequently, aluminium is deposited on the obtained side wall structure by an electron beam deposition device, and the deposited aluminium layer is patterned, so as to form a gate electrode passing through the inside of the opening (13), whereby an HEMT is completed (FIG. 3f). In the above case, the gate electrode (15) is in Schottky contact with the n-GaAs layer (5).

In the following, the operation of the device of the aforesaid embodiment will be explained.

When a current was applied to the aforesaid HEMT at a channel temperature of 175° C., drain voltage of 2 V, and drain current of 10 mA, for 1000 hours, the increase of leakage current was 5% or less, and therefore, the present HEMT was greatly improved with respect to leakage current, as compared with an HEMT of a conventional structure as illustrated in FIGS. 1a through 1d.

On examination of the C-V characteristics for an MIS diode having the structure of n-InGaP/n-GaAs/SiO$_2$/Al, it was confirmed that, as illustrated in FIG. 4, the interfacial level density was reduced to a great extent. It can be seen from this result that the leakage current on the interface between the SiO$_2$ film (14) constituting the side wall and the channel layers (10) was reduced. In this case, the test conditions were set such that the temperature was 300° K. and the frequency was 1 MHz.

In addition, the continuous line and broken line in FIG. 4 form a hysteresis loop.

It becomes clear from this test result that the leakage current in the interface between the n-GaAs and SiO$_2$ layers is very slight, and therefore, it is not at all necessary to further cover the n-GaAs layer (5) in the circumference of the gate electrode (15) with an i-GaAs layer, as proposed in, e.g., Japanese Unexamined Patent Publication No. 57-128070.

In addition, in the manufacturing process of the aforesaid embodiment, an n-InGaP layer (6) is interposed between the two n-GaAs layers 5 and 7, and the n-GaAs layer (7) on the upper side is etched so as to form the opening (13), whereafter the n-InGaAs layer (6) is selectively etched with hydrochloric acid or selectively etched by reactive ion etching using a reactive gas such as CCl$_2$F$_2$ or CHClF, so as to prevent the n-GaAs layer (5) on the lower level from becoming thinned. As a result, control of the film thickness of the channel layer 10 becomes easier.

Since the n-InGaP layer (6) has a low interfacial level density, the leakage current is not increased by provision of this layer.

(b) Explanation of another embodiment of the present invention

In the aforesaid embodiment of the present invention, there has been explained the case where a III-V Group semiconductor in a region widened from the gate electrode to form a depletion layer is InGaP. When this semiconductor layer is formed of an indium-containing III-V Group semiconductor material such as InP, InGaAsP, InAlAs and InSb, if these films of the compounds are covered with n-GaAs, and simultaneously, this n-GaAs is brought into Schottky contact with the gate electrode, the generation of leakage current in the circumference of the gate electrode can be controlled.

In addition, in the aforesaid embodiment, an explanation has been given with regard to a problem of the interfacial level of the indium-containing semiconductor layer covered with the SiO$_2$ film (14) covering the circumference of the gate electrode (15). Also when the indium-containing semiconductor layer is covered with SiN or SiON, there arises a similar problem. In this case, if the indium-containing semiconductor layer is coated with n-GaAs, an increase in the leakage current in the circumference of the gate electrode can be controlled, in the same way as described above.

In addition, the aforesaid structure may be applied also to a Schottky gate field effect transistor.

Although, in the above-mentioned embodiments, an explanation was given for the semiconductor devices in which an In-containing compound semiconductor is in Schottky contact with an electrode, similar results can be obtained where the present invention is applied to a semiconductor device in which an Al-containing compound semiconductor is in Schottky contact with an electrode.

As mentioned in the foregoing, according to the present invention, an indium-containing monoconductive semiconductor such as InP, InGaP, InGaAsP, InAlAs, and InSb is covered with a monoconductive GaAs layer (5), and on this layer (5), there are formed a gate electrode of a field effect transistor and an insulating film such as the films of SiO$_2$, SiN, and SiON. The increasing amount of leakage current is 5% or less according to an experimental result, and therefore, the electric characteristics of the present semiconductor device have greatly been improved as compared with a transistor having a conventional structure.

I claim:

1. A compound semiconductor device comprising:
   a first compound semiconductor layer;
   a second compound semiconductor layer, containing at least one of In and Al, which is in contact with the first compound semiconductor layer to generate a two dimensional electron gas layer in an interface between the first and second compound semiconductor layers;
   a third compound semiconductor layer comprising doped GaAs and coated on the second compound semiconductor layer, wherein said second and third compound semiconductor layers form an electron supplying layer;
   a source electrode and a drain electrode electrically connected to the two dimensional electron gas layer;
   a gate electrode formed between the source electrode and the drain electrode so as to be in Schottky contact with the third compound semiconductor layer; and
   an insulating film formed in contact with the third compound semiconductor layer and between the gate electrode and the source electrode, and formed in contact with the third compound semiconductor layer and between the gate electrode and the drain electrode.

2. The device as set forth in claim 1, wherein the source electrode and the drain electrode are electrically connected to the two dimensional electron gas layer through the second compound semiconductor layer and the third compound semiconductor layer.

3. The device as set forth in claim 2, further comprising:
   a fourth compound semiconductor layer formed between the source electrode and the third compound semiconductor layer and between the drain electrode and the third compound semiconductor layer; and
   the gate electrode extending from the third compound semiconductor layer up to above the fourth compound semiconductor layer to form an extended part above the fourth compound semiconductor layer, and the insulating film being formed between the extended part of the gate electrode and the fourth compound semiconductor layer.

4. The device as set forth in claim 1, wherein the insulating film consists of one of SiO$_2$, SiN and SiON.

5. The device as set forth in claim 1, wherein the second compound semiconductor layer consists of one of InP, InGaP, InGaAsP, InAlAs and InSb.

6. The device as set forth in claim 3, wherein the fourth compound semiconductor layer comprises:
   a surface layer consisting of a GaAs layer; and
   a compound semiconductor layer, having an etching rate different from that of the surface layer, formed between the surface layer and the third compound semiconductor layer.

7. The device as set forth in claim 6, wherein the compound semiconductor layer having a different etching rate consists of one of InGaP, AlGaAs and AlInAs.

8. The device as set forth in claim 1, wherein the third compound semiconductor layer has a thickness of 1 Å to 500 Å.

9. A compound semiconductor device, comprising:

a first compound semiconductor layer having a first surface;

a second compound semiconductor layer containing one of In and Al, having a first surface and a second surface, said first surface of said second compound semiconductor layer formed on said first surface of said first compound semiconductor layer to generate a two dimensional electron gas layer between the first and second compound semiconductor layers;

a third compound semiconductor layer comprising doped GaAs and having a first surface and a second surface, said first surface of said third compound semiconductor layer formed on said second surface of said second compound semiconductor layer;

a fourth compound semiconductor layer having a first surface and a second surface, said first surface of said fourth compound semiconductor layer formed on said second surface of said third compound semiconductor layer, an opening having walls being formed in said fourth compound semiconductor layer to create a first region and a second region of said fourth compound semiconductor layer, top surfaces of said first and second regions forming said second surface of said fourth compound semiconductor;

a source electrode and a drain electrode electrically connected to said two dimensional electron gas layer and respectively formed on said top surfaces of said first and second regions;

a gate electrode extending in the opening from the second surface of the third compound semiconductor layer to above a height of said source and drain electrodes; and an insulating film being in contact with and extending from said second surface of said third compound semiconductor layer, along the walls of the opening to portions of said top surfaces of said first and second regions, said insulating film being between said gate electrode and each of said source and drain electrodes and between said gate electrode and said fourth compound semiconductor layer.

10. The compound semiconductor device as claimed in claim 9, wherein said insulating film consists of one of $SiO_2$, SiN and SiON.

11. The compound semiconductor device as claimed in claim 9, wherein said fourth compound semiconductor layer comprises:

a surface layer consisting of GaAs; and a compound semiconductor layer having an etching rate different from that of said surface layer and formed between said surface layer and said third compound semiconductor layer.

* * * * *

UNITED STATES PATENT AND TRADEMARK OFFICE
CERTIFICATE OF CORRECTION

PATENT NO. : 5,789,767
DATED : August 4, 1998
INVENTOR(S) : Soshi OMURA

It is certified that error appears in the above-indentified patent and that said Letters Patent is hereby corrected as shown below:

Title Page, [63] Related U.S. Application Data, line 2, before "Ser. No." (both occurrences) insert --which is a continuation of--.

Title Page, [30] Foreign Application Priority Data, change "4-053563" to --4-053653--.

Col. 1,  line 12, delete "semiconductor device having".

Col. 3,  line 29, delete "GaAs" (second occurrence)
         line 37, delete "as";

Signed and Sealed this

Ninth Day of February, 1999

Attest:

Attesting Officer

Acting Commissioner of Patents and Trademarks